United States Patent [19]

Sofianos et al.

[11] Patent Number: 5,304,958
[45] Date of Patent: Apr. 19, 1994

[54] SAW OSCILLATOR GAIN AMPLIFIER WITH AUTO PHASE SHIFT

[75] Inventors: Paul B. Sofianos, Mesa; Phuc C. Pham, Chandler; Dwight D. Esgar, Mesa, all of Ariz.

[73] Assignee: Motorola, Inc., Schaumburg, Ill.

[21] Appl. No.: 979,677

[22] Filed: Nov. 20, 1992

[51] Int. Cl.⁵ .............................................. H03B 5/12
[52] U.S. Cl. ............................ 331/107 A; 331/107 R; 331/DIG. 3; 307/511; 307/231
[58] Field of Search ................ 331/64, 107 A, 108 B, 331/108 C, 158, 135-137, DIG. 3, 187; 307/231, 510, 511, 519, 522; 328/140; 333/193-196; 330/5.5

[56] References Cited

U.S. PATENT DOCUMENTS

| | | | |
|---|---|---|---|
| 3,626,316 | 12/1971 | Connell, Jr. | 331/56 |
| 3,735,288 | 5/1973 | Strauss | 332/18 |
| 4,272,736 | 6/1981 | Gercekci et al. | 331/108 B |
| 4,529,892 | 7/1985 | Reilly et al. | 307/361 |
| 4,644,297 | 2/1987 | Olds | 331/17 |
| 4,670,742 | 6/1987 | Wacha | 340/653 |
| 4,760,352 | 7/1988 | Ash | 331/107 A |
| 4,761,616 | 8/1988 | Ash | 331/107 A |
| 4,871,984 | 10/1989 | Laton et al. | 331/107 A |
| 5,156,666 | 9/1992 | Tamagawa | 331/64 |
| 5,204,674 | 3/1993 | Holben | 340/870.25 |

FOREIGN PATENT DOCUMENTS

| | | | |
|---|---|---|---|
| 52-053653 | 4/1977 | Japan | 307/231 |
| 56-031229 | 3/1981 | Japan | 331/108 B |
| 61-137404 | 6/1986 | Japan | 331/108 C |
| 62-287701 | 12/1987 | Japan | 331/64 |

OTHER PUBLICATIONS

"Missing-Pulse Detector Handles Variable Frequencies", by Joe Lyle and Jerry Titsworth, Electronics Apr. 12, 1979 p. 131.
"Voltage Controlled Surface Wave Resonator Oscillators", by Lawrence H. Ragan Texas Inst. Inc., 1976 Ultrasonics Symposium Proc., IEEE Cat. #76.

*Primary Examiner*—Robert J. Pascal
*Assistant Examiner*—Arnold Kinkead
*Attorney, Agent, or Firm*—Bradley J. Botsch, Sr.

[57] ABSTRACT

A gain stage for providing an automatic phase shift is provided. In particular, the gain stage detects whether an oscillation signal appears at its inputs. If an oscillation signal is not detected, then the gain stage inverts output signals occurring at outputs of a first amplifier before being respectively applied to inputs of a second amplifier. This has the overall effect of implementing a 180° phase shift of a signal appearing at the outputs of the gain stage with respect to a signal appearing at the inputs of the gain stage.

7 Claims, 1 Drawing Sheet

SAW OSCILLATOR GAIN AMPLIFIER WITH AUTO PHASE SHIFT

FIELD OF THE INVENTION

This invention relates to amplifiers and, in particular, amplifiers having an auto phase shift to be used in conjunction with surface acoustic wave (SAW) devices.

BACKGROUND OF THE INVENTION

When utilizing a SAW filter, the output of the SAW filter is typically coupled through at least one gain amplifier whose output is coupled back to the input of the SAW filter. The purpose of the gain amplifier is to ensure an overall loop gain greater than one, and to ensure that the output of the SAW filter provides an oscillatory signal. In general, if the output of the SAW filter does not provide an oscillatory signal, the differential inputs (or outputs) of the gain amplifier can simply be reversed thereby yielding an effective 180° phase shift and ensuring that an oscillatory signal appears at the output of the SAW filter as is known.

In the past, prior art has simply resorted to manually inverting the connection from the SAW filter to the differential gain amplifier to achieve the proper phase for oscillation. However, this involves making new bond contacts either from the output of the gain amplifier back to the input of the SAW filter, or from the output of the SAW filter to the input of the gain amplifier. Moreover, this procedure typically results in having to do a re-layout of the board.

Hence, there exists a need for an improved circuit and method for providing a 180° phase shift in a gain amplifier.

DETAILED DESCRIPTION OF THE DRAWINGS

Figure 1:
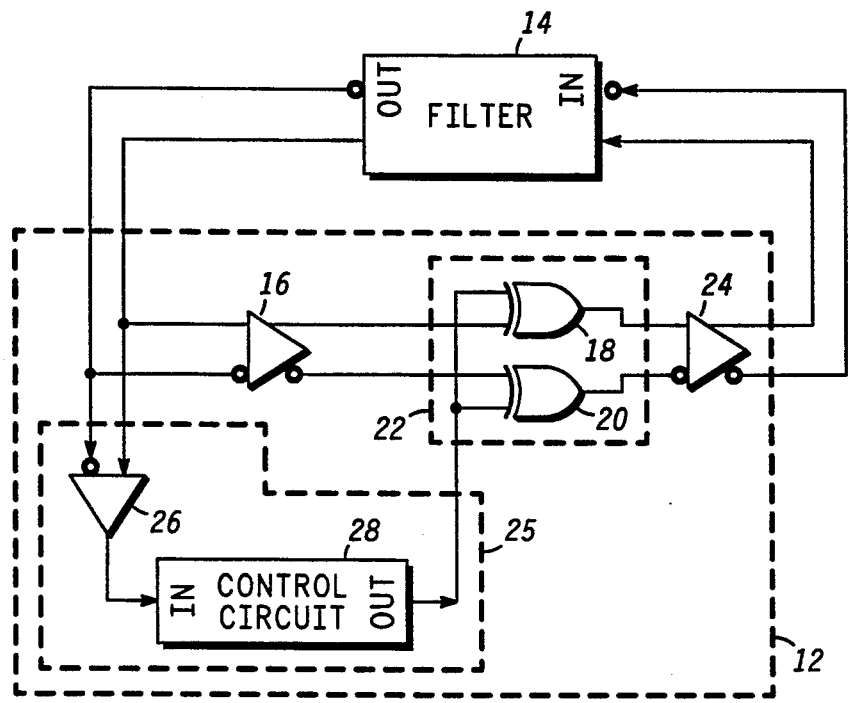
FIG. 1 is a detailed schematic/block diagram of an amplifier circuit for providing an automatic 180° phase shift from a gain amplifier to a feedback filter component in accordance with the present invention.

Referring to FIG. 1, gain stage 12 is shown for providing an automatic 180° phase shift from gain stage 12 to feedback filter component 14, for example, a SAW filter, which will ensure that an oscillatory signal appears at the output of filter 14.

Gain stage 12 includes differential gain amplifier 16 having a first input, for example a non-inverting input, coupled to a first output, for example, a non-inverting output, of filter 14, and a second input, for example, an inverting input, coupled to a second output, for example, an inverting output, of filter 14.

The first output, for example, a non-inverting output, of gain amplifier 16 is coupled to a first input of exclusive OR (XOR) gate 18. Similarly, a second output, for example, an inverting output, of gain amplifier 16 is coupled to a first input of XOR gate 20 wherein XOR gates 18 and 20 comprise phase shifter 22. The outputs of XOR gates 18 and 20 respectively coupled to first, for example, non-inverting, and second, for example, inverting, inputs of differential gain amplifier 24. A first output, for example a non-inverting output, of gain amplifier 24 is coupled to a first input, for example, a non-inverting input, of filter 14. Similarly, a second output, for example, an inverting output, of gain amplifier 24 is coupled to a second input, for example, an inverting input, of filter 14.

The first and second outputs of filter 14 are also coupled to oscillation detection circuit 25 which includes schmitt trigger 26 and control circuit 28. In particular, the first and second outputs of filter 14 are coupled to first, for example non-inverting, and second, for example inverting, inputs of Schmitt trigger 26, the latter having an output coupled to an input of control circuit 28. Finally, the output of control circuit 28 is coupled to the second inputs of both XOR gates 18 and 20 for providing a control logic signal thereat. It is understood that the inputs of gain stage 12 is taken to be the first and second inputs of gain amplifier 16, and the outputs of gain stage 12 is taken to be the outputs of gain amplifier 24.

Upon power up, the output of control circuit 28 provides a logic zero to the second inputs of XOR gates 18 and 20. As a result of the XOR logic function, the true version of the output signal (as opposed to the complement version) appearing at the first output of gain amplifier 16 is transferred, via XOR gate 18, to the first input of gain amplifier 24. Similarly, the true version of the output signal appearing at the second output of gain amplifier 16 is transferred, via XOR gate 20, to the first input of gain amplifier 24.

If the signal appearing at the first and second outputs of filter 14 is an oscillatory signal having a predetermined voltage swing, schmitt trigger 26 will respond to provide the oscillatory signal to the input of control circuit 28. In response, control circuit 28 will continue to provide a logic zero at its output and to the second inputs of XOR gates 18 and 20. As a result, the phase between gain amplifiers 16 and 24 does not need to be changed since oscillation is detected. In other words, the logic state of the output logic control signal of control circuit 28 will not change because an oscillation signal has been detected and no 180° phase shift is needed.

On the other hand, if no oscillatory signal of a predetermined voltage swing appears at the outputs of filter 14, schmitt trigger 26 will provide a no signal to the input of control circuit 28. This loss of signal will cause the output of control circuit 28 to switch from its initial logic zero state to a logic one state. This logic one appearing at the output of control circuit 28 also provides a logic one at the second inputs of XOR gates 18 and 20. As a result of the XOR logic function, the complement version of the output signal appearing at the first output of gain amplifier 16 is transferred, via XOR gate 18, to the first input of gain amplifier 24. Similarly, the complement version of the output signal appearing at the second output of gain amplifier 16 is transferred, via XOR gate 20, to the first input of gain amplifier 24. This has the effect of reversing the signals appearing at the first and second outputs of gain amplifier 16 with respect to their application to the first and second inputs of gain amplifier 24. Thus, it should be clear that phase shifter 22 automatically and electronically reverses the signals appearing at the first and second outputs of gain amplifier 16 before they are applied to the first and second inputs of gain amplifier 24. As a result, the desired 180° phase shift is accomplished thereby providing a gain stage which ensures that filter 14 oscillates.

Thus, the present invention includes gain stage 12 which detects whether an oscillatory signal appears at its inputs. If so, then the output of oscillation detector 28 remains unchanged. But, if no oscillatory signal appears at the inputs of gain stage 12, then the output of control circuit 28 is changed from an initial logic low state to a logic high state. This causes phase shift circuit 22 to invert the outputs appearing at the first and second outputs of gain amplifier 16 before they are respectively applied to first and second inputs of gain amplifier 24. Thus, an effective 180° phase reversal between the outputs of gain amplifier 16 and the inputs of gain amplifier 24 is accomplished.

Figure 2:
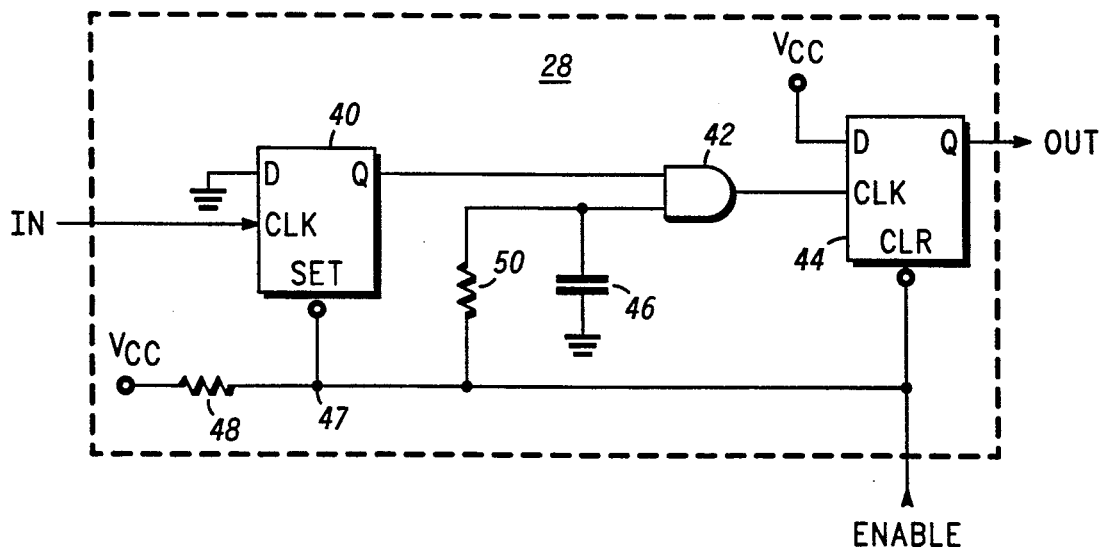
FIG. 2 is a detailed schematic/diagram illustrating one embodiment for an oscillation detector as shown in FIG. 1.

Referring to FIG. 2, at least one embodiment of a circuit utilized to implement oscillation detector circuit 28 of FIG. 1 is shown. In particular, control circuit 28 includes D-flipflop 40 having a clock input coupled to the input of control circuit 28, and a data input tied to receive a logic low voltage level, for example, ground reference.

The output of D-flipflop 40 is coupled to a first input of AND gate 42, the latter having an output coupled to a clock input of D-flipflop 44. The data input of D-flipflop 44 is coupled to receive a logic high voltage level, for example, supply voltage $V_{CC}$. The output of D-flipflop 44 is coupled to the output of control circuit 28. The second input of AND gate 42 is returned to ground reference via capacitor 46. The set input (SET) of D-flipflop 40 is coupled to circuit node 47 whereby circuit node 47 is coupled through resistor 48 to receive operating potential $V_{CC}$. Circuit node 47 is also coupled through resistor 50 to the second input of AND gate 42. Moreover, circuit node 47 is also coupled to the clear input (CLR) of D-flipflop 44. Circuit node 47 is also coupled to receive enable signal ENABLE.

Briefly, control circuit 28, upon power up, will provide a logic zero at its output, and will remain a logic zero if an oscillatory signal appears at the output of filter 14. However, if oscillatory signal is not detected, the output of control circuit 28 is switched from its initial logic zero state to a logic one state thereby enabling phase shifter 22 to provide a 180° phase shift as aforedescribed.

In particular, upon power on, voltage $V_{CC}$ is substantially low enough to provide a logic low at the set input of D-flipflop 40 and the clear input of D-flipflop 44 thereby initializing the output of D-flipflop 40 to a logic high and the output of D-flipflop 44 to a logic low. Moreover, at this time, the second input of AND gate 42 is at a logic low thereby assuring that no clock pulses are sent to D-flipflop 44.

As $V_{CC}$ increases, the voltage at circuit node 47 increases such that a logic high is recognized at the set and clear inputs of D-flipflops 40 and 44, respectively. However, due to a different RC time constant, the voltage level appearing at the second input of AND gate 42 is still indicative of a logic low.

During the predetermined time interval that it takes from when circuit node 47 reaches a logic high voltage level to the time the second input of AND gate 42 reaches a logic high voltage level, filter 14 is given time to enter oscillation. If the output of filter 14 is an oscillatory signal, then the output of schmitt trigger 26 is also an oscillatory signal. This oscillatory signal will cause the clocking of D-flip flop 40 thereby causing the initial logic high at the output of D-flipflop 40 to change to a logic low. Thus, when the second input to AND gate 42 finally reaches a voltage level indicative of a logic high state, the output of AND gate 42 remains a logic low and D-flipflop 44 is not clocked. Hence, the initial logic low state at the output of D-flipflop 44 remains unchanged since no phase reversal is needed.

On the other hand, if the output filter 14 is not an oscillatory signal, then the output signal of schmitt trigger 26 also does not oscillate. As a result, D-flip flop 40 will not be clocked thereby causing the initial logic high at the output of D-flipflop 40 to remain at a logic high. Thus, when the second input to AND gate 42 finally reaches a voltage level indicative of a logic high state, the output of AND gate 42 switches from a logic low to a logic high thereby clocking D-flipflop 44. As a result, the initial logic low state at the output of D-flipflop 44 is switched from its initial logic low state to a logic high state since a phase reversal is desired.

Once this phase reversal has been done, the output of filter 14 is now an oscillatory signal which propagates through schmitt trigger 26 to provide an oscillatory signal to the clock input of D-flipflop 40 as aforedescribed. But once D-flipflop 40 is clocked, this will cause a logic low to appear at the output of D-flipflop 40 which has the effect of disabling the clock to D-flipflop 44. Thus, the output of D-flipflop 44 will remain at the desired logic high state.

By now it should be apparent from the foregoing discussion that a novel gain stage for providing an automatic phase shift within the gain stage itself is provided. In particular, the gain stage includes first and second amplifiers where the first and second inputs of the first amplifier are coupled to inputs of the gain stage, while first and second outputs of the second amplifier are coupled to outputs of the gain stage. The gain stage also includes a logic circuit coupled between first and second outputs of the first amplifier and first and second inputs of the second amplifier. A detection circuit is also provided for determining whether an oscillation signal appears at the inputs of the gain stage. If an oscillation signal is not detected, then the logic circuit inverts the phase of outputs signals appearing at the first and second outputs of the first amplifier before being respectively applied to first and second inputs of the second amplifier. This has the overall effect of implementing an automatic 180° phase shift of the signal appearing at the outputs of the gain stage with respect to a signal appearing at the inputs of the gain stage.

The present invention also includes a method for providing an automatic phase reversal of a differential input signal with respect to a differential output signal of a gain stage, the gain stage including first and second differential amplifiers and a logic circuit, the first amplifier having first and second inputs being coupled to receive the differential input signal, the second amplifier having first and second outputs being coupled to provide the differential output signal, the logic circuit being coupled between first and second outputs of the first amplifier and first and second inputs of the second amplifier, the method comprising the steps of: initializing a logic input of the logic circuit to a first logic state such that a first output of the first amplifier is passed to a first input of the second amplifier and that a second output of the first amplifier is passed to a second input of the second amplifier; determining whether the input signal is an oscillatory signal having a predetermined voltage swing; maintaining the logic input of the logic circuit at the first logic state if an oscillatory signal has been detected; and changing the logic input of the logic circuit to a second logic state if an oscillatory signal has not been detected thereby causing a 180° phase shift of the output signal with respect to the input signal.

While the invention has been described in conjunction with specific embodiments thereof, it is evident that many alternations, modifications and variations will be apparent to those skilled in the art in light of the forgoing description. Accordingly, it is intended to embrace all such alternations, modifications and variations in the appended claims.

We claim:

1. A gain stage circuit for providing an automatic phase shift of a differential input signal with respect to a differential output signal, the differential input signal appearing at first and second inputs, the differential output signal appearing at first and second outputs, comprising:

a first amplifier having first and second inputs and first and second outputs, said first and second inputs of said first amplifier being respectively coupled to the first and second inputs of the gain stage;

a second amplifier having first and second inputs and first and second outputs, said first and second outputs of said second amplifier being respectively coupled to first and second outputs of the gain stage;

a detection circuit having a first and second inputs and an output, said first and second inputs of said detection circuit being coupled to said first and second inputs of said first amplifier, said output of said detection circuit providing a logic control signal; and a phase shift circuit having a plurality of inputs and first and second outputs, first and second ones of said plurality of inputs of said phase shift circuit being respectively coupled to said first and second outputs of said first amplifier, third and fourth ones of said plurality of inputs of said phase shift circuit being coupled to said output of said detection circuit to receive said logic control signal, said first and second outputs of said phase shifter being respectively coupled to said first and second inputs of said second amplifier.

2. The gain stage circuit according to claim 1 wherein said detection circuit includes:

trigger means for providing a signal at an output when the input signal is an oscillatory signal having a predetermined voltage swing, said trigger means having first and second inputs respectively coupled to said first and second inputs of said first amplifier; and control means having an output for providing said logic control signal to said phase shift circuit, said control means having an input coupled to said output of said trigger means.

3. The gain stage circuit according to claim 2 wherein said control means includes:

a first D-flipflop having a data input, a clock input, a set input and an output, said data input of said first D-flipflop being coupled to receive a voltage indicative of a first logic state, said clock input of said first D-flipflop being coupled to said input of said control means;

an AND gate having first and second inputs and an output, said first input of said AND gate being coupled to said output of said first D-flipflop;

a second D-flipflop having a data input, a clock input, a clear input and an output, said data input of said second D-flipflop being coupled to receive a voltage indicative of a second logic state, said clock input of said second D-flipflop being coupled to said output of said AND gate, said output of said second D-flipflop being coupled to said output of said control means, said clear input of said second D-flipflop being coupled to said set input of said first D-flipflop;

a capacitor being coupled between said second input of said AND gate and ground reference;

a first resistor being coupled between said set input of said first D-flipflop and a first supply voltage terminal; and a second resistor being coupled between said set input of said first D-flipflop and said second input of said AND gate.

4. A gain stage circuit coupled across a filter device for ensuring that an output signal of the filter device is an oscillatory signal, the filter device having first and second inputs and first and second outputs, comprising:

a first amplifier having first and second inputs and first and second outputs, said first and second inputs of said first amplifier being respectively coupled to the first and second outputs of the filter device;

a second amplifier having first and second inputs and first and second outputs, said first and second outputs of said second amplifier being respectively coupled to first and second inputs of the filter device;

a detection circuit having a first and second inputs and an output, said first and second inputs of said detection circuit being coupled to said first and second inputs of said first amplifier, said output of said detection circuit providing a logic control signal, said logic control signal remaining in an initial first logic state when the output signal of the filter device is an oscillatory signal, said logic control signal being forced to a second logic state when the output signal of the filter device is not an oscillatory signal; and a phase shift circuit having a plurality of inputs and first and second outputs, first and second ones of said plurality of inputs of said phase shift circuit being respectively coupled to said first and second outputs of said first amplifier, third and fourth ones of said plurality of inputs of said phase shift circuit being coupled to said output of said detection circuit to receive said logic control signal, said first and second outputs of said phase shifter being respectively coupled to said first and second inputs of said second amplifier, when said logic control signal is in a first logic state said phase shift circuit providing true versions of signals appearing at said first and second outputs of said first amplifier to said first and second inputs of said second amplifier, when said logic control signal is in a second logic state said phase shift circuit providing complement versions of signals appearing at said first and second outputs of said first amplifier to said first and second inputs of said second amplifier.

5. The gain stage circuit according to claim 4 wherein said detection circuit includes:

trigger means for providing a signal at an output when the input signal is an oscillatory signal having a predetermined voltage swing, said trigger means having first and second inputs respectively coupled to said first and second inputs of said first amplifier; and control means having an output for providing said logic control signal to said phase shift circuit, said control means having an input coupled to said output of said trigger means.

6. The gain stage circuit according to claim 5 wherein said control means includes:

a first D-flipflop having a data input, a clock input, a set input and an output, said data input of said first D-flipflop being coupled to receive a voltage indicative of a first logic state, said clock input of said first D-flipflop being coupled to said input of said control means;

an AND gate having first and second inputs and an output, said first input of said AND gate being coupled to said output of said first D-flipflop;

a second D-flipflop having a data input, a clock input, a clear input and an output, said data input of said second D-flipflop being coupled to receive a voltage indicative of a second logic state, said clock input of said second D-flipflop being coupled to said output of said AND gate, said output of said second D-flipflop being coupled to said output of said control means, said clear input of said second D-flipflop being coupled to said set input of said first D-flipflop;

a capacitor being coupled between said second input of said AND gate and ground reference;

a first resistor being coupled between said set input of said first D-flipflop and a first supply voltage terminal; and a second resistor being coupled between said set input of said first D-flipflop and said second input of said AND gate.

7. A method for providing an automatic phase reversal of a differential input signal with respect to a differential output signal of a gain stage, the gain stage including first and second differential amplifiers and a logic circuit, the first amplifier having first and second inputs being coupled to receive the differential input signal, the second amplifier having first and second outputs being coupled to provide the differential output signal, the logic circuit being coupled between first and second outputs of the first amplifier and first and second inputs of the second amplifier, the method comprising the steps of:

initializing a logic input of the logic circuit to a first logic state such that a first output of the first amplifier is passed to a first input of the second amplifier and that a second output of the first amplifier is passed to a second input of the second amplifier;

determining whether the input signal is an oscillatory signal having a predetermined voltage swing;

maintaining said logic input of the logic circuit at said first logic state if an oscillatory signal has been detected; and changing said logic input of the logic circuit to a second logic state if an oscillatory signal has not been detected thereby causing a 180° phase shift of the output signal with respect to the input signal.

* * * * *